United States Patent
Gehoski et al.

(10) Patent No.: US 7,163,888 B2
(45) Date of Patent: Jan. 16, 2007

(54) DIRECT IMPRINTING OF ETCH BARRIERS USING STEP AND FLASH IMPRINT LITHOGRAPHY

(75) Inventors: Kathy A. Gehoski, Gilbert, AZ (US); William J. Dauksher, Mesa, AZ (US); Ngoc V. Le, Gilbert, AZ (US); Douglas J. Resnick, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 66 days.

(21) Appl. No.: 10/995,800

(22) Filed: Nov. 22, 2004

(65) Prior Publication Data

US 2006/0110914 A1 May 25, 2006

(51) Int. Cl.
*H01L 21/4763* (2006.01)

(52) U.S. Cl. .................. 438/627; 438/641; 438/654

(58) Field of Classification Search ............ 438/627, 438/628, 633, 637, 641, 643, 654
See application file for complete search history.

(56) References Cited

U.S. PATENT DOCUMENTS

| | | | |
|---|---|---|---|
| 6,334,960 B1 | 1/2002 | Wilson et al. | |
| 6,387,787 B1 * | 5/2002 | Mancini et al. | 438/586 |
| 6,576,374 B1 * | 6/2003 | Kim | 430/5 |
| 2003/0142486 A1 * | 7/2003 | Arakawa et al. | 361/818 |
| 2004/0224261 A1 * | 11/2004 | Resnick et al. | 430/311 |

OTHER PUBLICATIONS

S.C. Johnson et al., "Advanced in Step and Flash Imprint Lithography", Proceedings of SPIE, vol. 5037 (2003) pp. 197-202.
Matthew Colburn, et al., "Step and Flash Imprint Lithography for sub-100nm Patterning," Proceedings of SPIE, vol. 3997, pp. 453-457.

* cited by examiner

*Primary Examiner*—Phuc T. Dang

(57) ABSTRACT

A direct imprinting process for Step and Flash Imprint Lithography includes providing (40) a substrate (12); forming (44) an etch barrier layer (14) on the substrate; patterning (46) the etch barrier layer with a template (16) while curing with ultraviolet light through the template, resulting in a patterned etch barrier layer and a residual layer (20) on the substrate; and performing (48) an etch to substantially remove the residual layer. Optionally, a patterning layer (52) may be formed on the substrate (12) prior to forming the etch barrier layer (14). Additionally, an adhesive layer (13) may be applied (42) between the substrate (12) and the etch barrier layer (14).

8 Claims, 3 Drawing Sheets

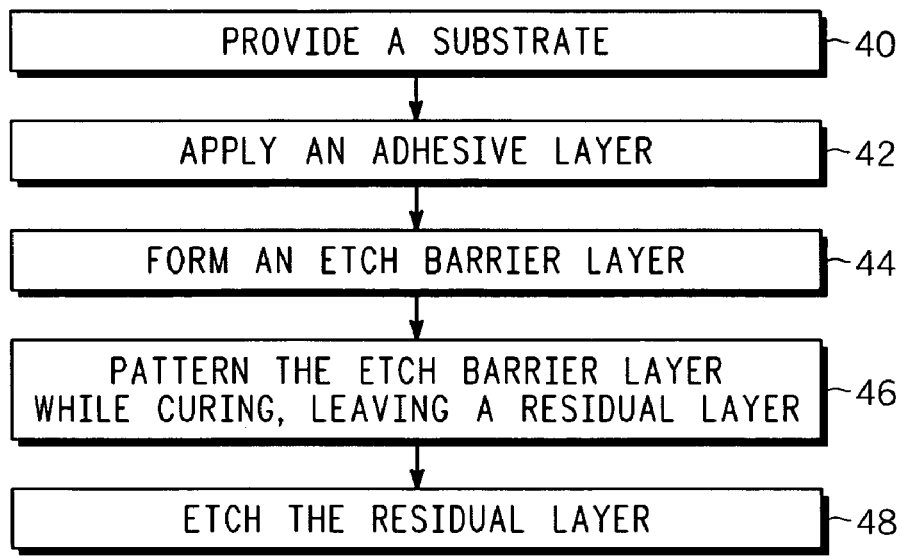
FIG. 4
FIG. 8
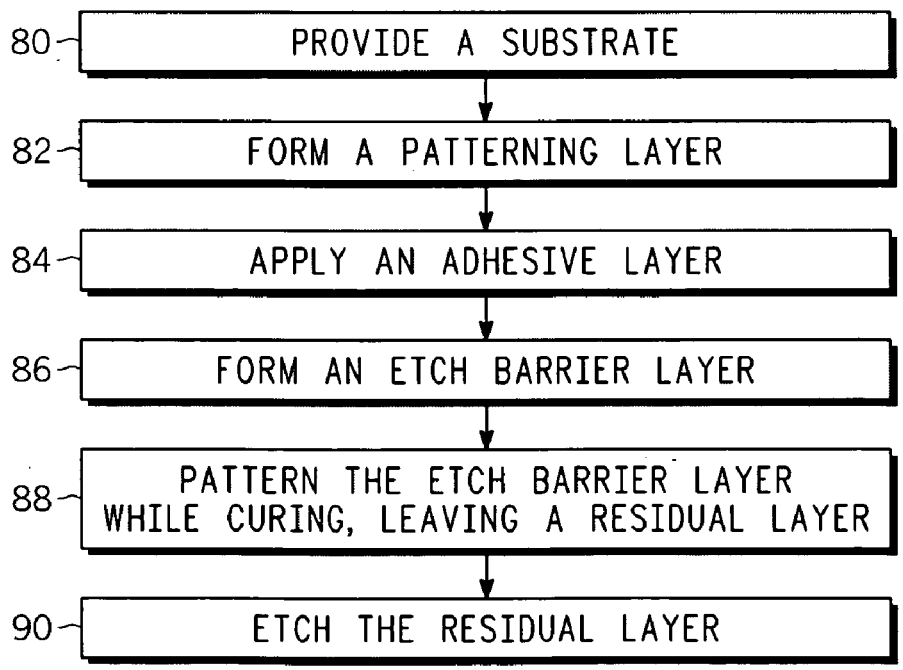

DIRECT IMPRINTING OF ETCH BARRIERS USING STEP AND FLASH IMPRINT LITHOGRAPHY

FIELD OF THE INVENTION

The present invention relates to semiconductor devices, microelectronic devices, micro electro mechanical devices, magnetic devices, microfluidic devices, photonic devices, and more particularly to a method of making these devices using a direct imprinting process for Step and Flash Imprint Lithography.

BACKGROUND OF THE INVENTION

The fabrication of integrated circuits involves the creation of several layers of materials that interact in some fashion. One or more of these layers may be patterned so various regions of the layer have different electrical characteristics, which may be interconnected within the layer or to other layers to create electrical components and circuits. These regions may be created by selectively introducing or removing various materials. The patterns that define such regions are often created by lithographic processes. For example, a layer of photoresist material is applied onto a layer overlying a wafer substrate. A photomask (containing clear and opaque areas) is used to selectively expose this photoresist material by a form of radiation, such as ultraviolet light, electrons, or x-rays. Either the photoresist material exposed to the radiation, or that not exposed to the radiation, is removed by the application of a developer. An etchant may then be applied to the layer not protected by the remaining resist, and when the resist is removed, the layer overlying the substrate is patterned.

Lithographic processes such as that described above are also typically used to transfer patterns from a photomask to a device. As feature sizes on semiconductor devices decrease into the submicron range, there is a need for new lithographic processes, or techniques, to pattern, for example, high-density semiconductor devices. Several new lithographic techniques which accomplish this need and have a basis in imprinting and stamping have been proposed. One in particular, Step and Flash Imprint Lithography has been shown to be capable of patterning lines as small as 20 nm.

Step and Flash Imprint Lithography templates are typically made by applying a layer of chrome, 2–100 nm thick, on to a transparent quartz plate. A resist layer is applied to the chrome and patterned using either an electron beam or optical exposure system. The resist is then placed in a developer to form patterns on the chrome layer. The resist is used as a mask to etch the chrome layer. The chrome then serves as a hard mask for the etching of the quartz plate. Finally, the chrome is removed, thereby forming a quartz template containing relief images in the quartz.

Overall, Step and Flash Imprint Lithography techniques benefit from their unique use of photochemistry, the use of ambient temperatures, and the low pressure required to carry out the Step and Flash Imprint Lithography process. During a typical Step and Flash Imprint Lithography process, a substrate is coated with an organic planarization layer (also known as a transfer layer), and brought into close proximity of a transparent Step and Flash Imprint Lithography template, typically comprised of quartz, containing a relief image and coated with a low surface energy material. An ultraviolet or deep ultraviolet sensitive photocurable organic solution is deposited between the template and the coated substrate. Using minimal pressure, the template is brought into contact with the substrate, and more particularly the photocurable organic layer (also known as an etch barrier). Next, the organic layer is cured, or crosslinked, at room temperature by illuminating through the template. The light source typically uses ultraviolet radiation. A range of wavelengths (150 nm–500 nm) is possible, depending upon the transmissive properties of the template and photosensitivity of the photocurable organic layer. The template is next separated from the substrate and the organic layer, leaving behind an organic replica of the template relief on the planarization layer. This pattern is then etched with a short halogen break-through, followed by either an oxygen or ammonia dry etch process, for example, RIE (reactive ion etch), ICP (inductively coupled plasma), ECR (electron cyclotron resonance), to form a high-resolution, high aspect-ratio feature in the organic layer and planarization layer. Thus, the current state-of-the-art requires two etch steps for feature pattern transfer.

Step and Flash Imprint Lithography technology has been demonstrated to resolve features as small as 20 nm. As such, a wide variety of feature sizes may be drawn on a single wafer. Certain problems exist though with this Step and Flash Imprint Lithography pattern transfer methodology as described above. In particular, a potential exists for critical dimension bias and added defects due to the planarization layer etch. Further, it would be advantageous to develop a process without the planarization layer because that would require one less processing step, thereby reducing cost of any devices fabricated in this way. Oxygen and ammonia are typically used to obtain good etch selectivity between the etch barrier and the planarization layer when the silicon content of the etch barrier is low, for example, equal to or below 10%. Poor selectivity results in feature size or critical dimension bias.

BRIEF SUMMARY OF THE INVENTION

A selective etch process for Step and Flash Imprint Lithography includes providing a substrate; forming an etch barrier layer on the substrate; patterning the etch barrier layer with a template while curing with ultraviolet light through the template, resulting in a patterned etch barrier layer and a residual layer on the substrate; and performing an etch to substantially remove the residual layer. A second embodiment includes forming a patterning layer on the substrate prior to forming the etch barrier layer. Optionally, an adhesive layer may be applied between the substrate and the etch barrier layer.

BRIEF DESCRIPTION OF THE DRAWINGS

The present invention will hereinafter be described in conjunction with the following drawing figures, wherein like numerals denote like elements.

FIG. 4 illustrates the steps in accordance with the first embodiment of the present invention.

FIG. 8 illustrates the steps in accordance with the second embodiment of the present invention.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

The present invention relates to a direct imprinting process for Step and Flash Imprint Lithography wherein an etch barrier layer is deposited directly on the substrate, or alternatively on a patterning layer overlying the substrate, thereby reducing critical dimension bias and added defects due to an otherwise required planarization layer etch and providing a simplified process to form high-resolution, high aspect-ratio features in Step and Flash Imprint Lithography.

Referring to FIGS. 1–4 for a structure fabricated using a first embodiment of the present invention, an etch barrier layer 14 comprising a photo curable monomer mixture is dispensed in the area of the substrate 12 to be printed. The substrate may comprise, for example, one of silicon, silicon carbide, gallium nitride, gallium arsenide, plastic, lithium niobate, glass. Some of these materials may be subsequently etched for processing steps in fabricating certain devices, for example, MEMS (micro electro mechanical devices).

The etch barrier layer 14 may comprise any number of organic monomer, or mixture of monomers, such as acrylics, ethers, esters, epoxies, or the like for greater etch resistance. The etch barrier layer 14 may also comprise a silicon containing monomer. Optionally, an adhesive layer 13 may be deposited on the substrate 12 prior to depositing the etch barrier layer 14 for improving the adhesion between the etch barrier layer 14 and the substrate 12. The adhesive layer 13 is between 0.5 to 50 nanometers thick and may comprise, for example, diamond like carbon, polymer like carbon, or a self assembled monolayer as the adhesive, which may be applied by plasma enhanced CVD, spun on, or vapor deposited, for example.

Figure 2:
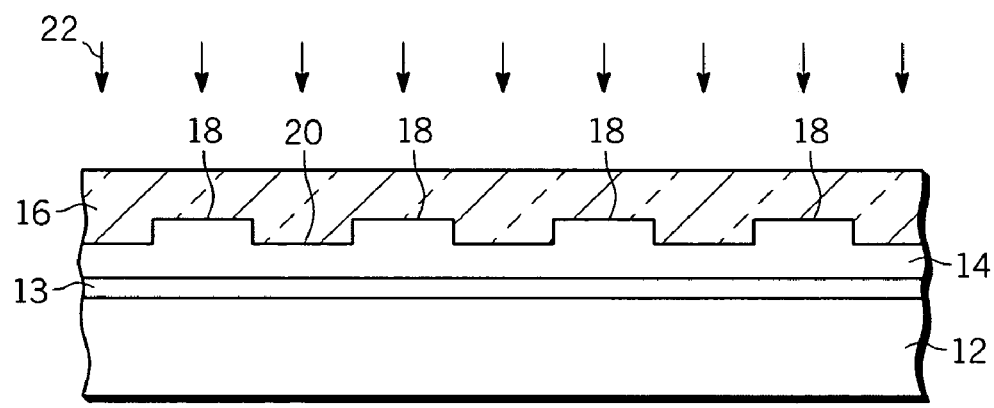
FIG. 2 illustrates a template being applied to the layers of material of the first embodiment.

Referring to FIG. 2, a transparent template 16 is applied with slight pressure to the etch barrier layer 14 to create the pattern comprising printed features 18 in the etch barrier layer 14. A residual layer 20 comprising the etch barrier layer 14 that was not affected by the application of the template will remain surrounding the printed features 18. The residual layer 20 is between 1 to 200 nanometers, and typically 50 nanometers, thick. The etch barrier layer 14 remaining above the residual layer typically is between 20 to 1000 nanometers, and preferably 100 nanometers thick. The template 16 is fabricated using one of many known methods, and may for example, comprise the template as disclosed in U.S. Pat. No. 6,580,172.

Figure 1:
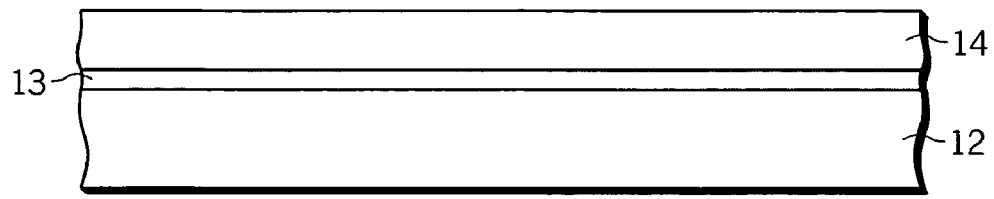
FIG. 1 illustrates layers of material used in a first embodiment of the present invention.
Figure 3:
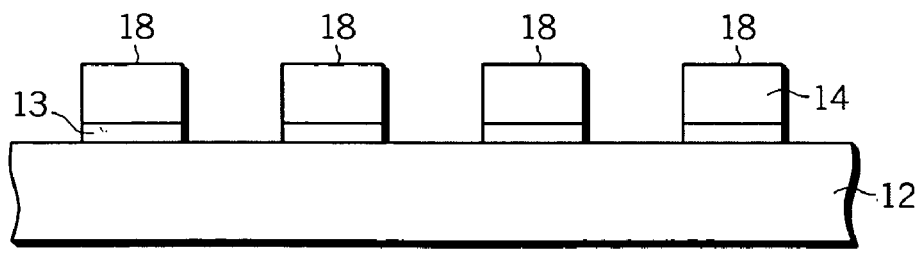
FIG. 3 illustrates the material subsequent to a first etch of the first embodiment.

Shown in FIG. 4 is a process flow diagram wherein a semiconductor structure, generally illustrated in FIGS. 1–3, is fabricated in accordance with the preferred embodiment of the present invention. Initially, a substrate 12 is provided 40. Optionally, an adhesive layer 13 may be deposited 42 on the substrate 12 prior to depositing the etch barrier layer 14 for improving the adhesion between the etch barrier layer 14 and the substrate 12. The etch barrier layer 14 is formed 44 on the substrate 12 in accordance with the description given for FIG. 1. The lithographic template 16 is applied with a slight pressure to pattern 46 the etch barrier layer 14. Radiation 22 such as ultra violet light is transmitted through the lithographic template 16 to cure the etch barrier layer 14 and the residual layer formed while the mask is being applied as illustrated in FIG. 2. The template is thereafter removed from the semiconductor device. The residual layer 20 is then etched 48 and substantially removed, thereby leaving a patterned layer 18 as illustrated in FIG. 3. The same etch chemistry that is used to remove the residual layer may also be used to etch the adhesion layer 13 if present. It should be understood that although the structure fabricated in accordance with the present invention is described in the preferred embodiment as being used to fabricate a semiconductor device, that anticipated is the formation of other devices including microelectronic devices, magnetic devices, micro electro mechanical devices, microfluidic devices, or photonic devices in the remaining structure illustrated in FIG. 3.

Figure 5:
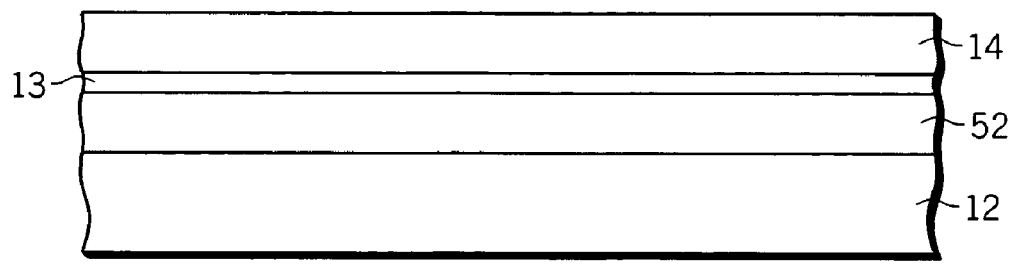
FIG. 5 illustrates layers of material used in a second embodiment of the present invention.

Referring to FIG. 5 and in accordance with another embodiment of the present invention, a patterning layer 52 is formed on the substrate 12. The substrate may comprise, for example, one of silicon, silicon carbide, gallium nitride, gallium arsenide, plastic, lithium niobate, glass. Some of these materials may be subsequently etched for processing steps in fabricating certain devices, for example, MEMS. The patterning layer is between 1 and 1000 nanometers thick and comprises, for example, aluminum, tantalum nitride, silicon, silicon nitride, diamond like carbon, polymer like carbon, a self assembled monolayer, or alloys or oxides thereof. An etch barrier layer 14 comprising a photo curable monomer mixture is dispensed on the patterning layer. The etch barrier layer 14 may comprise any number of organic monomer, or mixture of monomers, such as acrylics, ethers, esters, epoxies, or the like for greater etch resistance. The etch barrier layer may also comprise a silicon containing monomer. Optionally, an adhesive layer 13 may be deposited on the substrate 12 prior to depositing the etch barrier layer 14 for improving the adhesion between the etch barrier layer 14 and the substrate 12. The adhesive layer 13 is between 1 to 50 nanometers thick and may comprise, for example, diamond like carbon, polymer like carbon, or a self assembled monolayer as the adhesive, which may be applied by plasma enhanced CVD, spun on, or vapor deposited, for example.

Figure 6:
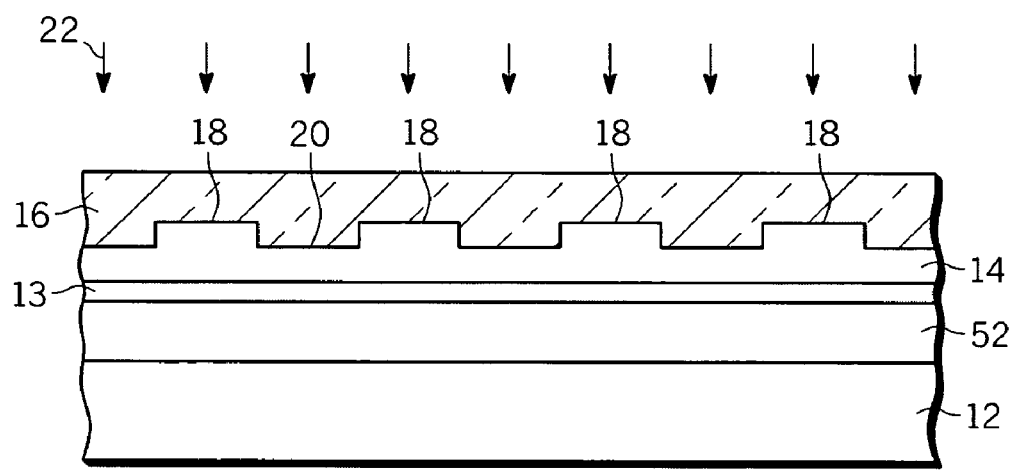
FIG. 6 illustrates a template being applied to the layers of material of the second embodiment.

Referring to FIG. 6, a transparent template 16 is applied with slight pressure to the etch barrier layer 14 to create the pattern comprising printed features 18 in the etch barrier layer 14. A residual layer 20 comprising the etch barrier layer 14 that was not affected by the application of the template will remain surrounding the printed features 18. The residual layer is between 1 to 200 nanometers, and typically 50 nanometers, thick. The etch barrier layer remaining above the residual layer typically is between 20 to 1000 nanometers, and preferably 100 nanometers thick. The template 16 is fabricated using one of many known methods, and may for example, comprise the template as disclosed in U.S. Pat. No. 6,580,172.

Radiation 22, such as x-rays or electrons, but more preferably ultra violet light, is transmitted for 0.5 second to 1 minute, preferably for 0.1 second, through the transparent template 16 to cure the residual layer 20 and the etch barrier layer 14. The template is then removed. A dry etch, of $CF_4/O_2$ for example, is performed, removing substantially all the residual layer 20 and the optional adhesion layer 13 if present, resulting in the structure as shown in FIG. 7 while also removing some of the etch barrier layer 14.

Figure 7:
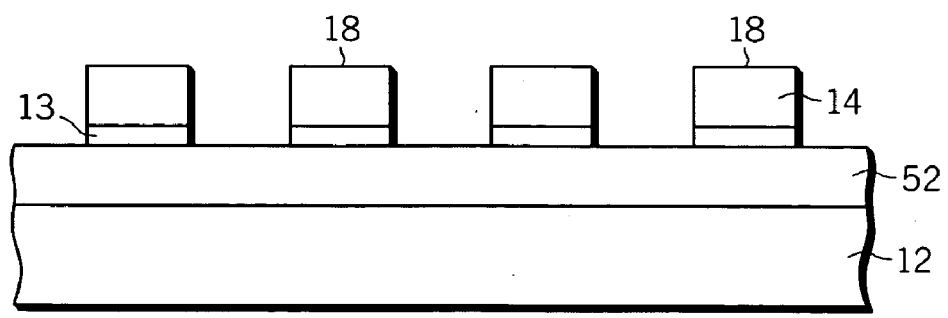
FIG. 7 illustrates the material subsequent to a first etch of the second embodiment.

Shown in FIG. 8 is a process flow diagram wherein a semiconductor structure, generally illustrated in FIGS. 5–7, is fabricated in accordance with the second embodiment of the present invention. Initially, a substrate 12 is provided 80. The patterning layer 52 is formed 82 on the substrate 12. Optionally, an adhesive layer 13 may be deposited 84 on the patterning layer 52 prior to depositing the etch barrier layer 14 for improving the adhesion between the etch barrier layer 14 and the patterning layer 52. The etch barrier layer 14 is formed 86 on the patterning layer 52 in accordance with the description given for FIG. 5. The lithographic template 16 is applied with a slight pressure to pattern 88 the etch barrier layer 14. Radiation 22 such as ultra violet light is transmitted through the lithographic template 16 to cure the etch barrier layer 14 and the residual layer formed while the mask is being applied as illustrated in FIG. 6. The template is thereafter removed and the residual layer 20 and the optional adhesion layer 13 is then etched 90 and substantially removed as shown in FIG. 7. It should be understood that although the structure fabricated in accordance with the present invention is described in the preferred embodiment as being used to fabricate a semiconductor device, that anticipated is the formation of other devices including microelectronic devices, magnetic devices, micro electro mechanical devices, microfluidic devices, photonic devices in the remaining structure illustrated in FIG. 7.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

The invention claimed is:

1. A method comprising:
   providing a substrate;
   forming an etch barrier layer directly on the substrate, the etch barrier layer comprising one of an organic monomer, a silicon containing monomer, or a mixture of monomers including acrylics, ethers, esters, or epoxies;
   applying a transparent template with pressure against the etch barrier layer resulting in a patterned etch barrier layer and a residual layer, both formed on the substrate from the etch barrier layer;
   curing the patterned etch barrier layer and the residual layer with radiation through the template; and
   performing an etch to substantially remove the residual layer, wherein at least a portion of the patterned etch barrier layer remains on the substrate.

2. The method as in claim 1 further comprising forming a semiconductor element on the substrate.

3. The method as in claim 1 wherein the etch barrier layer comprises approximately 10% silicon.

4. The method as in claim 2 wherein the semiconductor element is one of a microelectronic device, a magnetic device, a photonic device, a micro electro mechanical device, a microfluidic device, or a semiconductor device.

5. The method as in claim 1 further comprising forming an adhesive layer on the substrate prior to forming the etch barrier layer.

6. The method as in claim 5 wherein the adhesive layer is between 0.5 and 50 nanometers thick.

7. The method as in claim 1 wherein the substrate comprises one of silicon, silicon carbide, gallium nitride, gallium arsenide, plastic, lithium niobate, or glass.

8. The method as in claim 1 wherein the etch barrier layer is between 20 and 1000 nanometers thick.

* * * * *